United States Patent [19]
DeDontney et al.

[11] Patent Number: 5,849,088
[45] Date of Patent: Dec. 15, 1998

[54] FREE FLOATING SHIELD

[75] Inventors: Jay Brian DeDontney, Santa Cruz; Lawrence Duane Bartholomew, Felton, both of Calif.

[73] Assignee: Watkins-Johnson Company, Palo Alto, Calif.

[21] Appl. No.: 8,024

[22] Filed: Jan. 16, 1998

[51] Int. Cl.$^6$ .................................................. C23C 16/00
[52] U.S. Cl. ........................... 118/719; 118/725; 118/729
[58] Field of Search .................................... 118/715, 719, 118/725, 729

[56] References Cited

U.S. PATENT DOCUMENTS

| | | | |
|---|---|---|---|
| 4,834,020 | 5/1989 | Bartholomew | 118/729 |
| 5,487,784 | 1/1996 | Ellis | 118/729 |

OTHER PUBLICATIONS

Watkins–Johnson "Injector Vent Assemblies", WJ–TEOS999 APCVD System, Physical & Functional, pp. 4–78, 4–79, 4–68.

*Primary Examiner*—Richard Bueker
*Attorney, Agent, or Firm*—Flehr Hohbach Test Albritton & Herbert, LLP

[57] ABSTRACT

A protective shield and an atmospheric pressure chemical vapor deposition system including a protective shield. The shield includes a frame assembly including a pair of spaced end walls and a pair of side walls extending between and mounted to the end walls, and a plurality of shield bodies carried by the frame assembly. Each of the shield bodies includes a base, a perforated sheet carried by the base, a plenum between the base and the perforated sheet, and a gas delivery device for delivering an inert gas to the plenum at a flow rate such that the gas diffuses through the perforated sheet. The chemical vapor deposition system includes a plurality of processing chambers, a conveyor for transporting substrates through the processing chambers, buffer chambers isolating the processing chambers from the rest of the process path all enclosed within a muffle. A protective shield mounted in the processing chambers includes injector shield bodies positioned adjacent the injector and shunt shield bodies spaced from the injector shield bodies, an inlet port between the injector shield bodies, and an outlet port between the shunt shield bodies for the flow of reagents through the protective shield. The shunt shield bodies each include a plenum filled with an inert gas and a bottom outlet port coupled to the plenum for delivering a supply of inert gas below the protective shield to form buffer barriers on opposite sides of the injection ports. The shield body captures the perforated sheets and shield bodies such that the sheets and shield body base can freely expand and contract relative to each other and the end walls under varying temperature conditions, maintaining the precise chamber geometry control required for CVD processing.

29 Claims, 9 Drawing Sheets

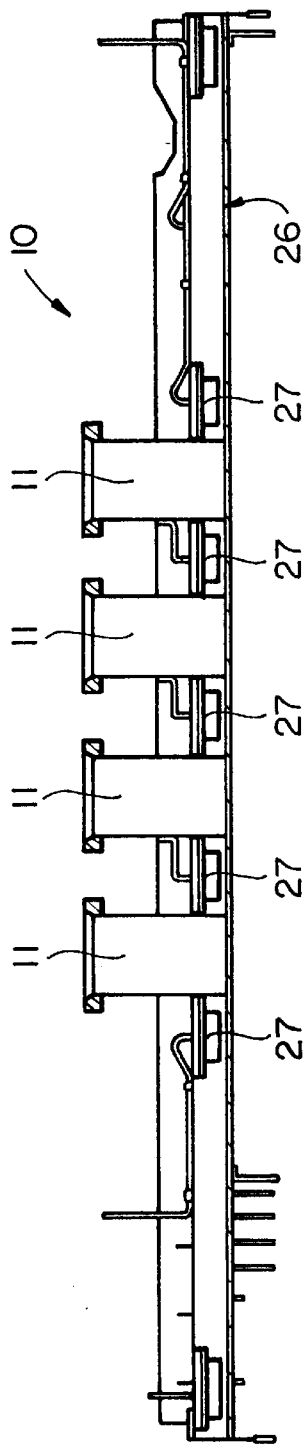
FIG_1
(PRIOR ART)
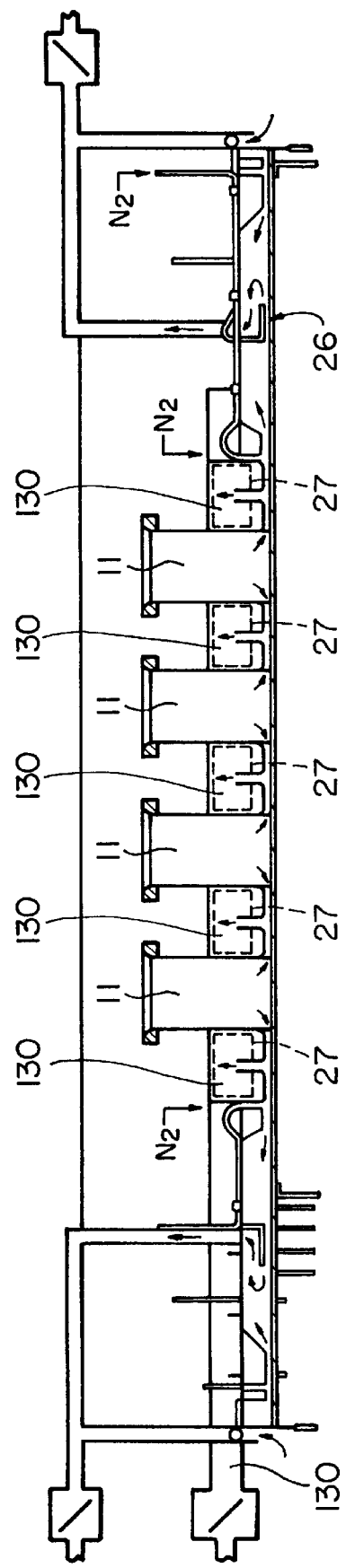
FIG_15

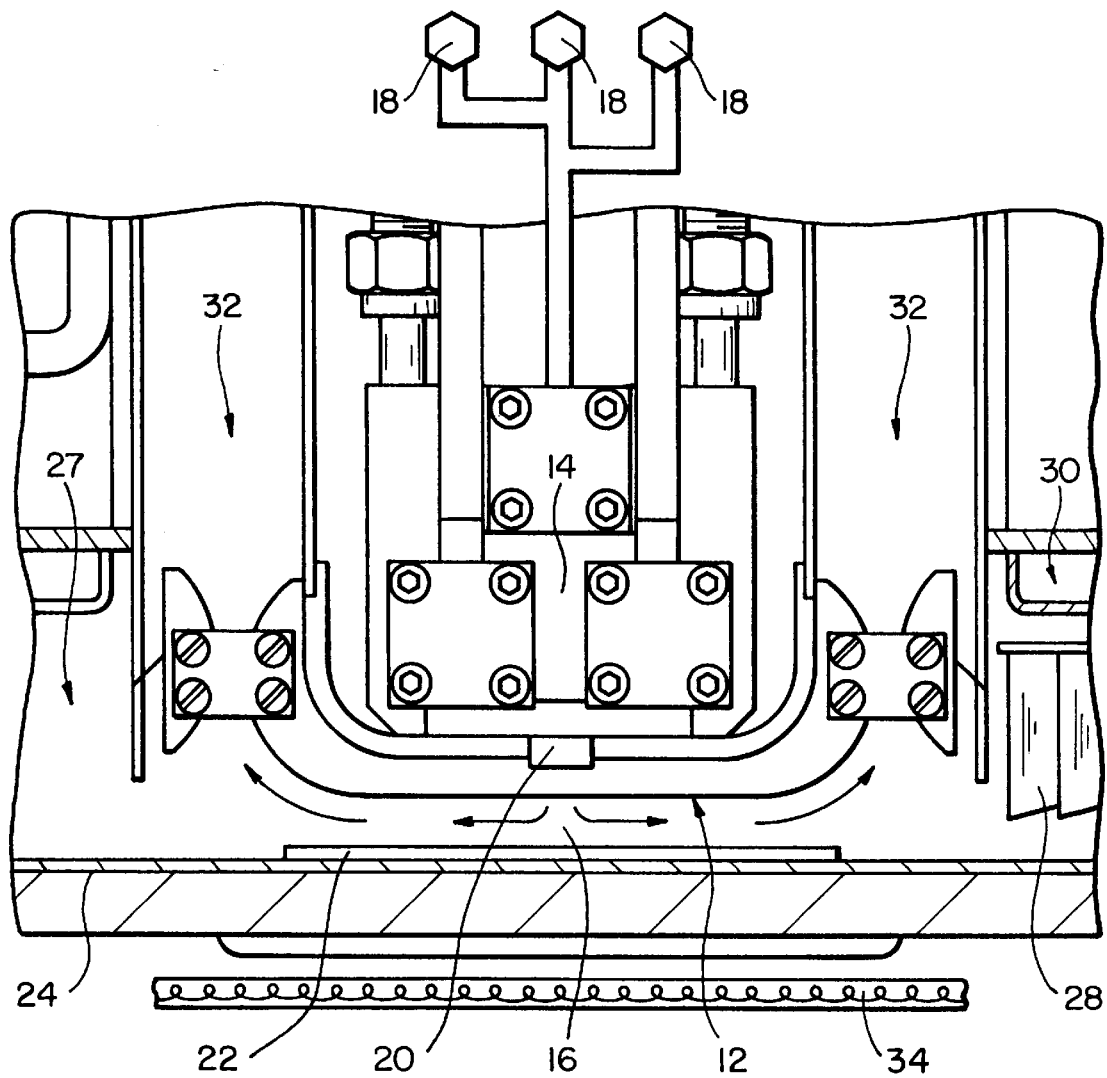
FIG_2
(PRIOR ART)

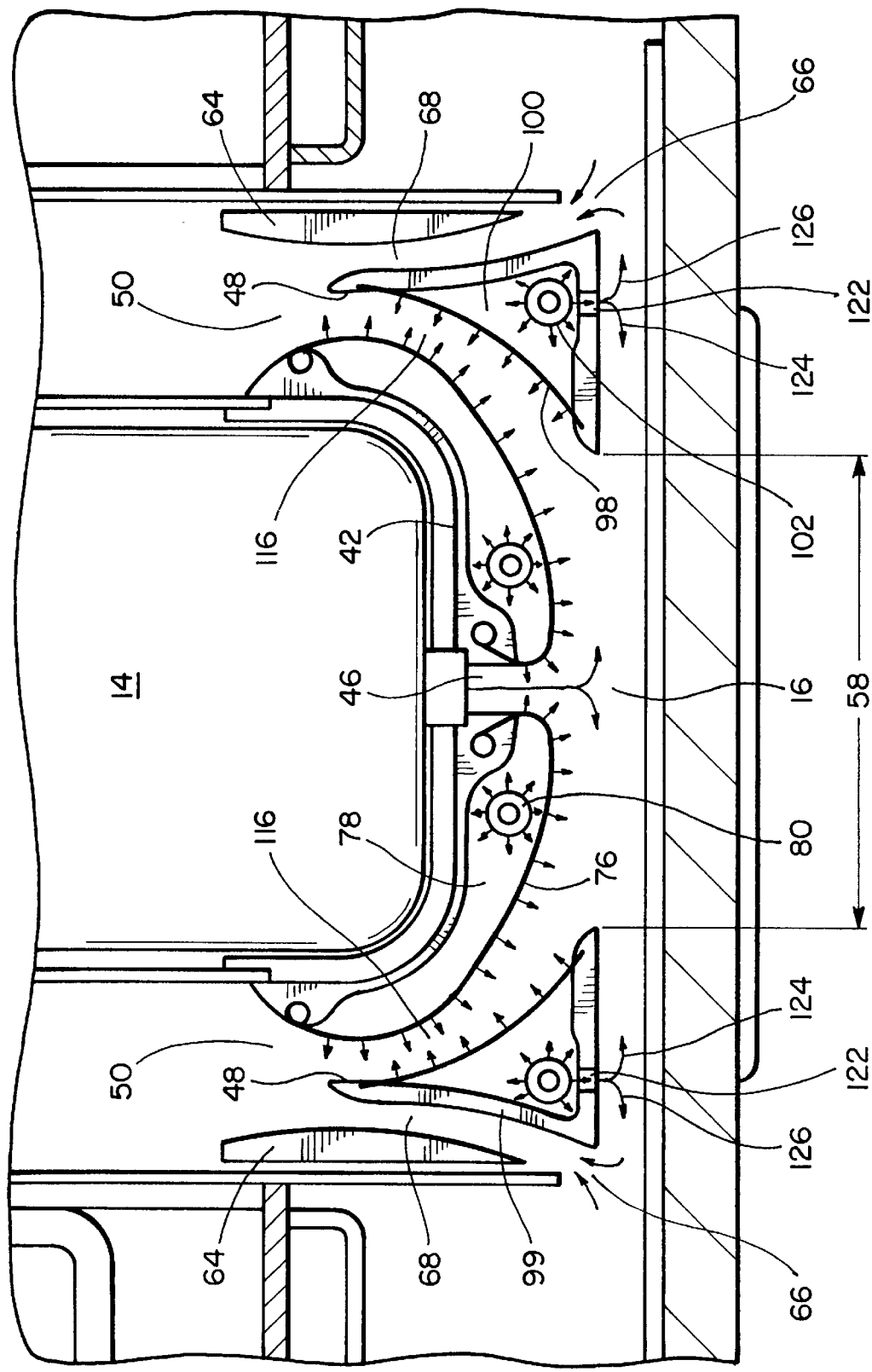
FIG_3

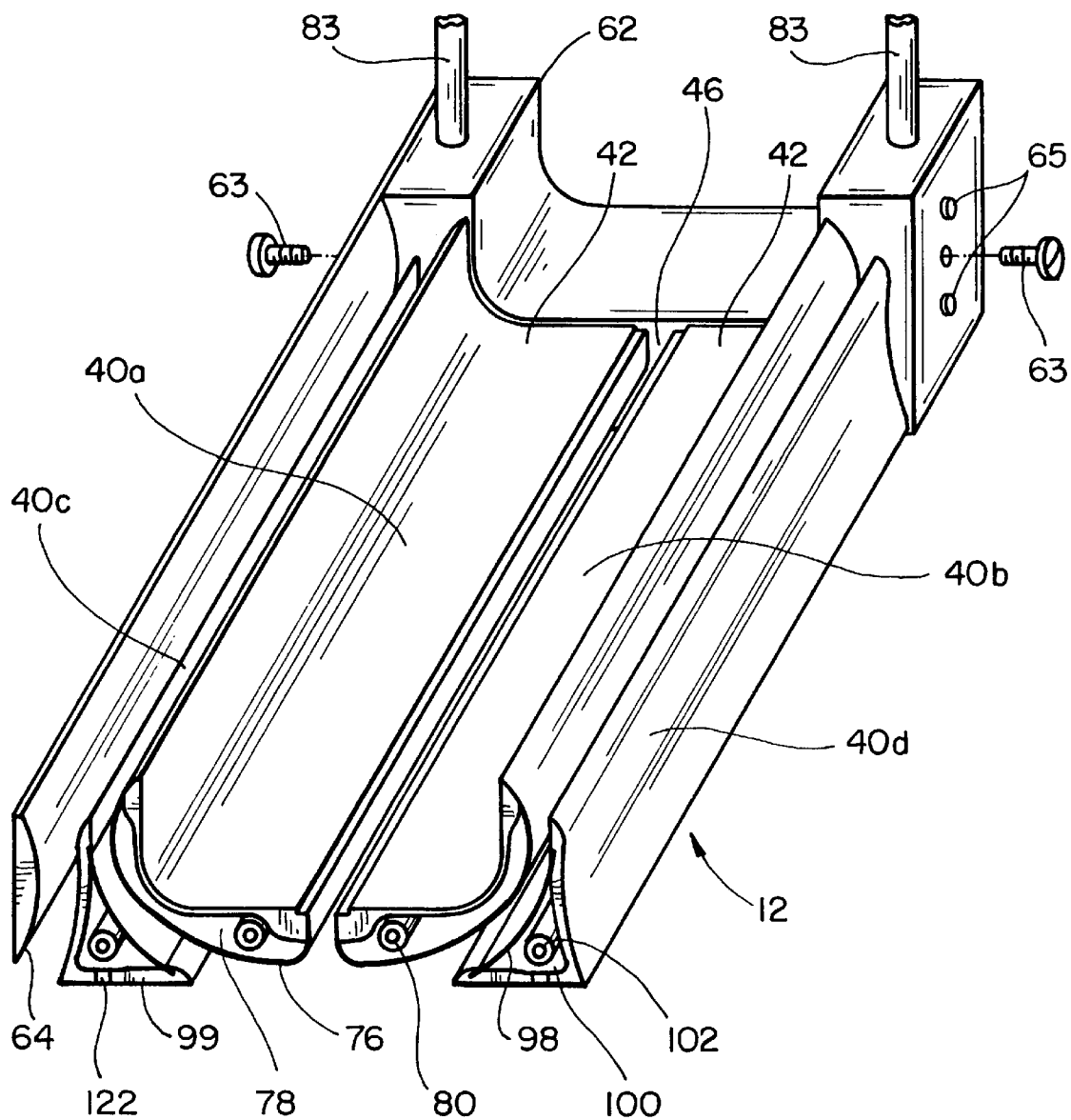
FIG_4

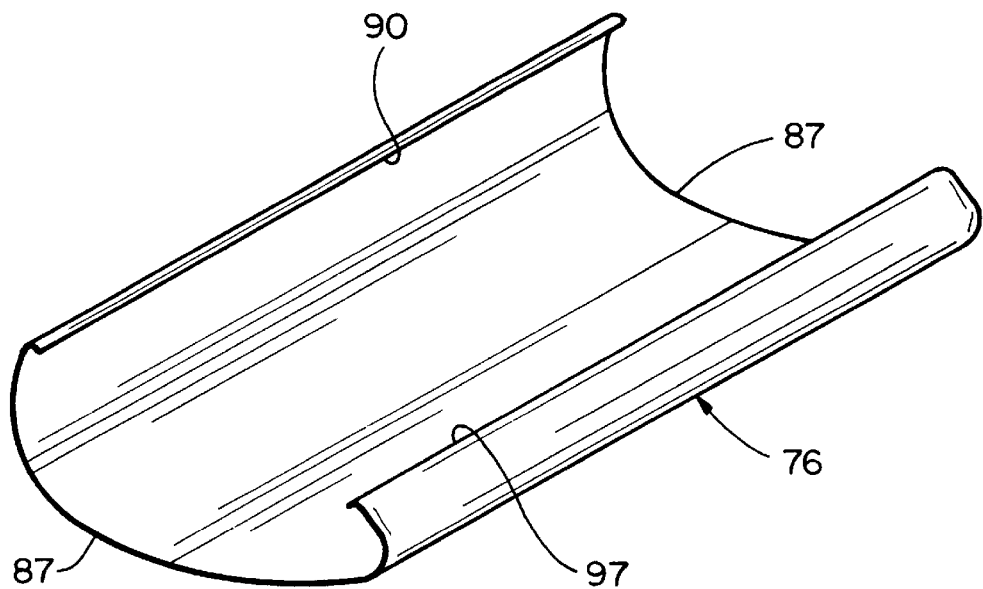
FIG_5
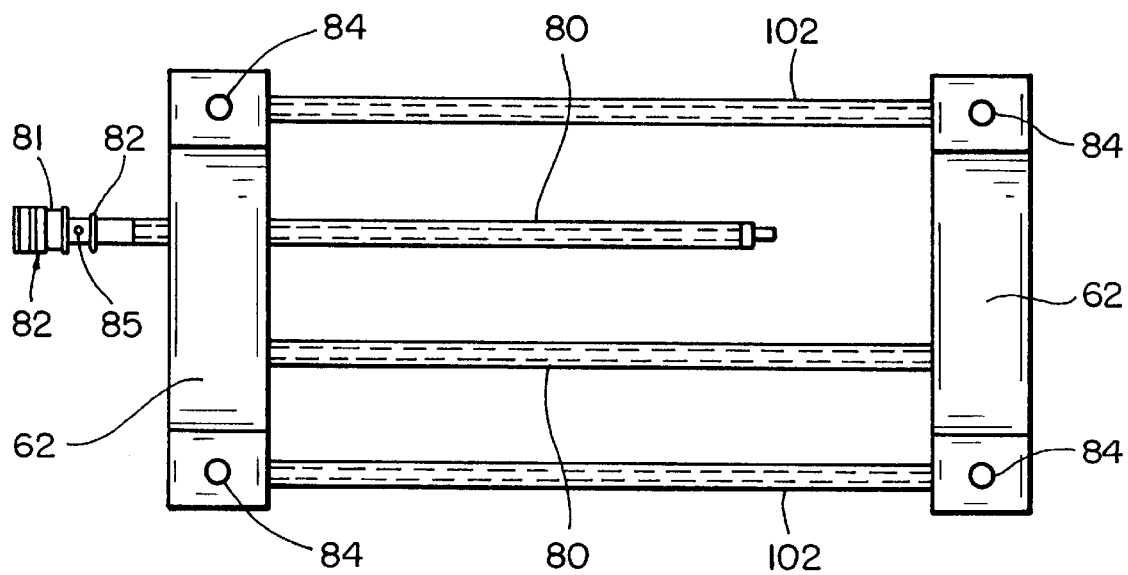
FIG_6

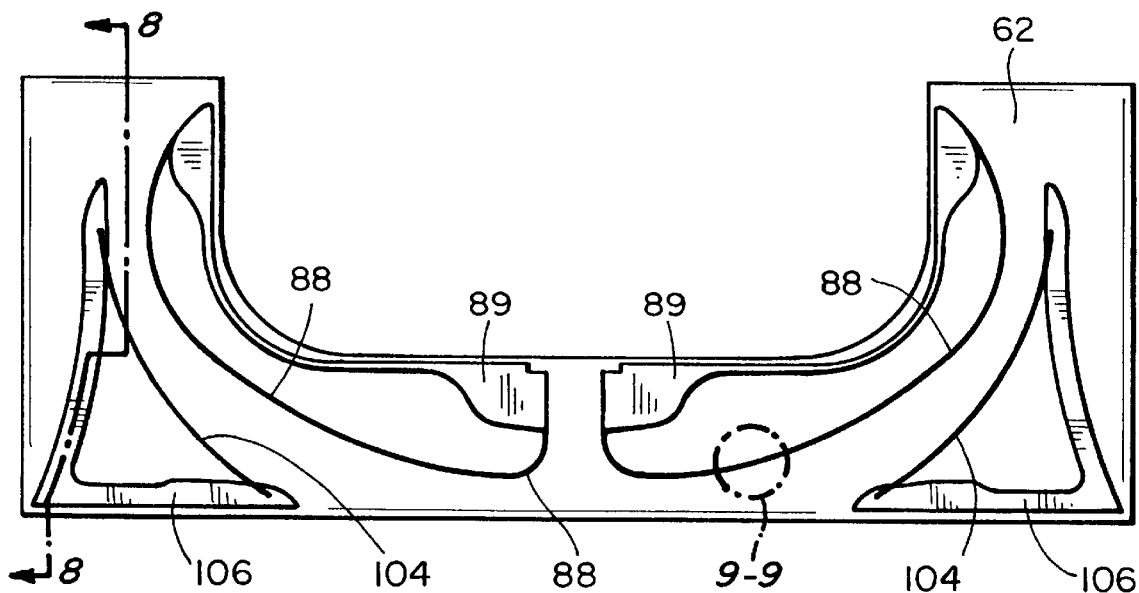
FIG_7
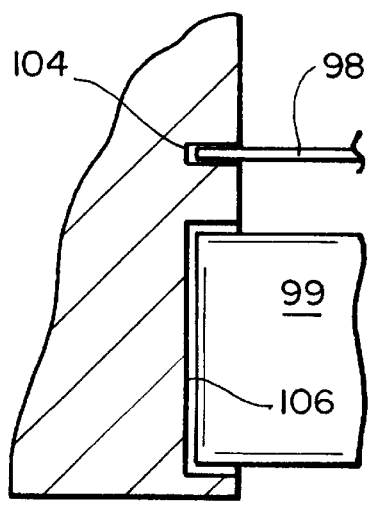
FIG_8
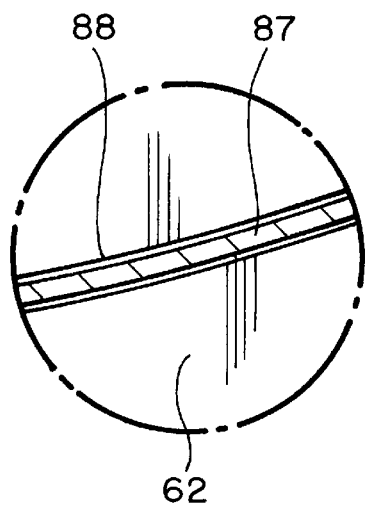
FIG_9

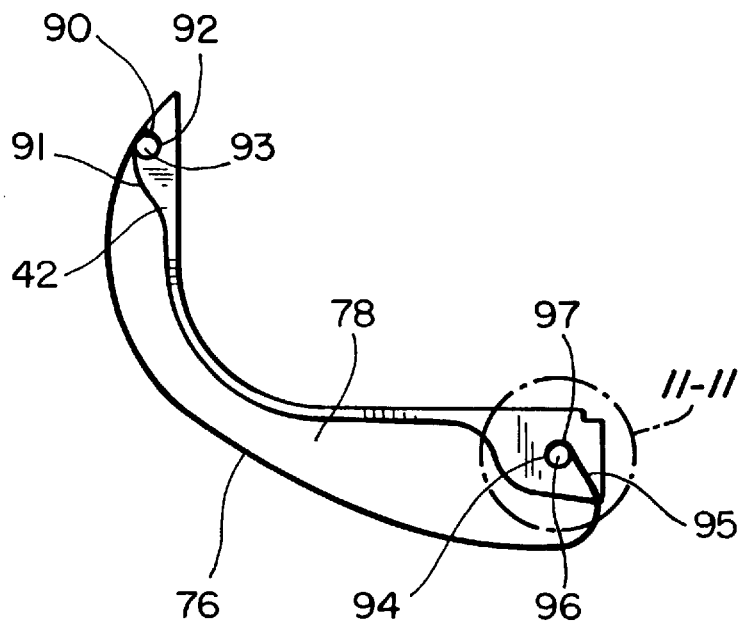
FIG_10
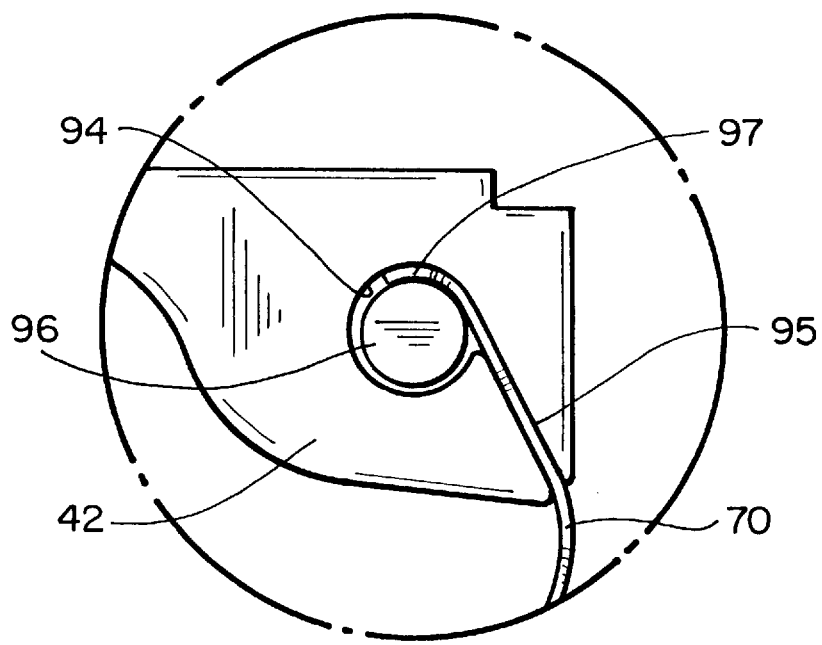
FIG_11

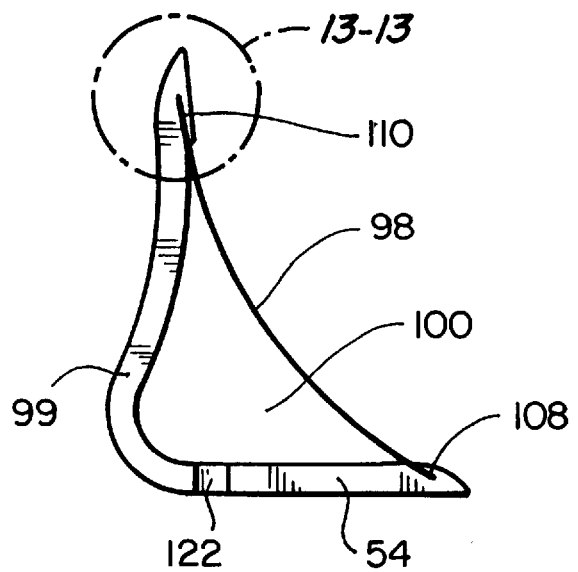
FIG_12
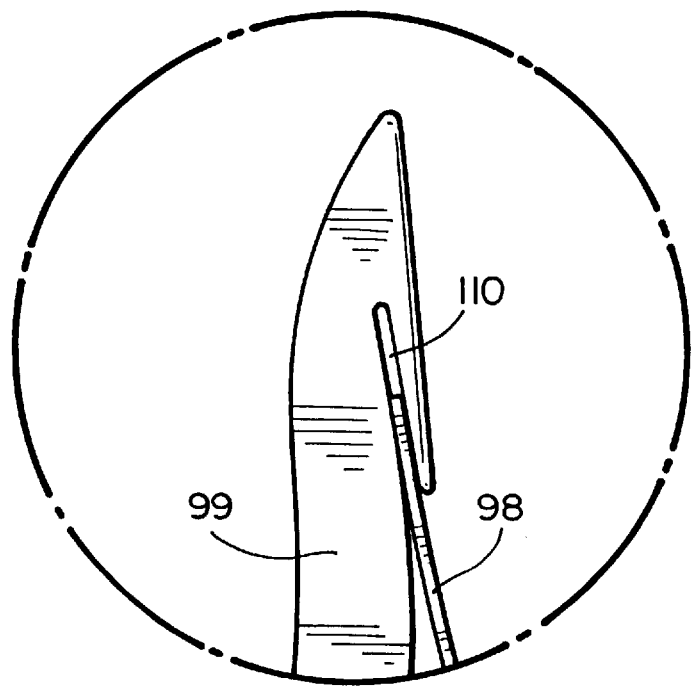
FIG_13

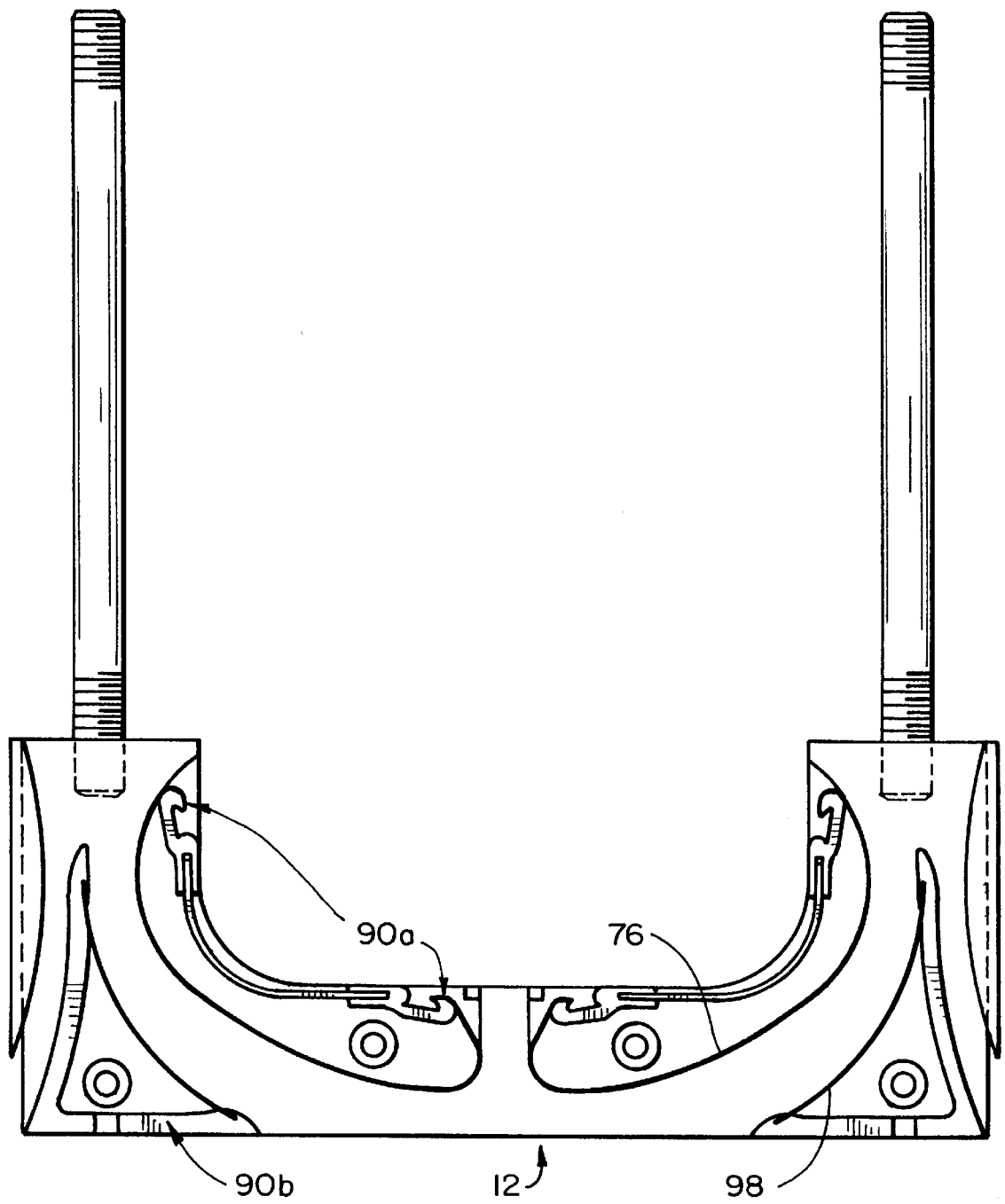
FIG_14

FREE FLOATING SHIELD

BRIEF DESCRIPTION OF THE INVENTION

The present invention relates in general to a protective shield for chemical vapor deposition systems and, more particularly, to a gas shield for reducing film deposition on the processing equipment.

BACKGROUND OF THE INVENTION

Chemical vapor deposition (CVD) systems are used to form a thin, uniform layer or film on a substrate such as a semiconductor silicon. During CVD processing, the substrate is exposed to one or more gaseous substances such as silane, phosphane, diborane, oxygen, ozone and the like, and chemical vapors such as TEOS (tetraethylorthosilicate, TMB (trimethylborate), TMPi (trimethylphosphate) and the like. The gases are injected into a clean, isolated reaction chamber and allowed to mix and interact with the other gases and/or the surface of the substrate to produce the desired film. The CVD systems typically employ injectors which deliver the gaseous substances directly to the surface of the substrate. An exhaust system removes waste products, such as unreacted gases and powders formed during the reaction, from the reaction chamber. Over time, films are deposited on the exposed surfaces of the chamber creating sources of particulate contamination which may become embedded in the film or degrade film uniformity. In many applications including semiconductor processing, film characteristics such as purity and thickness uniformity must meet high quality standards. To preserve film quality and prevent unacceptable defect levels, the reaction chamber must be cleaned to remove the deposited films.

The injection ports are typically positioned less than one inch from the surface of the substrate. With this limited clearance between the injector and the substrate surface, the surfaces of the injector and chamber walls will become coated with the material produced during the reactions. To reduce the amount of build-up in this area, some CVD systems include shields which are positioned in front of the injectors and exhaust port. The shields include a perforated screen welded to a support body. Supply tubes deliver an inert gas such as nitrogen to the volume between the support body and the screen. The nitrogen exits the shield through the perforated screen to slow the rate at which materials accumulate on the shield during processing.

The desired reactions for chemical vapor deposition typically occur at elevated temperatures, for example 300° C. to 600° C., with the substrate and chamber being heated to the appropriate temperature for a selected process. The high temperatures in the reaction chamber create thermal stresses in the perforated screen which may cause the screen to buckle after a period of time. The thermal deformation of the perforated screen disrupts the uniform flow of nitrogen through the screen, leaving portions of the screen unprotected against the accumulation of deposition materials. The ability of the screen to deliver nitrogen to the reaction chamber is further reduced as the screen becomes coated with deposition materials, requiring removal and cleaning or replacement of the shield. Since the screen essentially defines an upper "wall" of the reaction chamber, the deformed screen also interferes with the uniformity and distribution of the process reactant chemistries within the reaction chamber. The delays created by removal of the shield for cleaning or the replacement of a damaged shield are time consuming and expensive. A shield in which thermal deformation of the screen is minimized or eliminated is desirable. A shield which provides a uniform supply of the inert gas to the reaction chamber is also desirable. A shield in which a damaged screen surface can be quickly and inexpensively replaced is similarly desirable.

For atmospheric pressure CVD (APCVD) processing, the substrates are transported during processing by a conveyor which carries the substrates through one or more reaction chambers. The reaction chamber is not an enclosed chamber, but is merely the area in front of the injector between a series of curtains which use an inert gas such as nitrogen to isolate the reaction chamber from the rest of the process path. The exhaust vents on either side of the injector are used to extract unused gases and reaction by-products from the reaction chamber. If the exhaust is extracted at a rate slower than the rate at which the gases are introduced to the reaction chamber, some of the reactants may escape from the reaction chamber. Thus, with prior art systems the flow rate of the exhaust is typically greater than the rate at which gases are injected into the chamber, with excess inert gas being drawn into the reaction chamber from the area between the reaction chambers to provide a buffer zone blocking the escape of reactant gases. However, the gas drawn into the chamber from the adjacent buffer zones is not uniformly metered across the width of the reaction chamber. Thus, a non-uniform gas-to-gas boundary is created along the width of the reaction chamber. A shield which effectively prevented the escape of reactant gases from the reaction chamber without interfering with the reaction chemistries is desirable. As gases are pulled into the exhaust vent from the area below the injector on one side of the vent and the buffer zone between the reaction chambers on the other side of the vent, a large volume of reactant gas recirculation is created between the opposing flow streams. A shield which efficiently exhausts reactant gases from the chamber and minimizes the amount of gas recirculation within the reaction chamber is desirable.

OBJECTS AND SUMMARY OF THE INVENTION

It is a primary object of the present invention to provide a shield assembly for protecting the exposed surfaces of a gas injector, chamber wall, or exhaust vent used in CVD processing.

It is a further object of the present invention to provide a shield assembly which uniformly delivers an inert gas to surfaces of the shield assembly during extended use of the shield assembly, and allows use of a smooth undistorted surface shape.

It is another object of the present invention to provide a shield assembly which will withstand the high temperatures necessary for the chemical reactions occurring within the chamber, without gas leakage or deformation of the shield assembly or surface delivering protective gas flow.

It is yet another object of the present invention to provide a shield assembly with removable and replaceable screens.

It is another object of the present invention to provide a shield assembly which provides separate dual exhaust paths for reactant gases and by-products versus ambient gas drawn into the chamber.

It is still another object of the present invention to provide a shield assembly which creates an inert gas buffer zone preventing the escape of reactant gases from the chamber.

It is another object of the present invention to provide a shield assembly which can supply excess inert gas to flow out of the chamber instead of requiring adjacent ambient gas to be drawn into the chamber in order to prevent the escape of reactant gases from the chamber in an open APCVD system.

It is an additional object of the present invention to provide a shield assembly which minimizes recirculation of the reactant gases within the chamber while protecting the exhaust vent path surfaces.

Another object of the present invention is to provide a shield assembly allowing a new muffle design having APCVD process modules or chambers isolated by buffer modules which extract excess inert gas from the chambers rather than supply excess gas drawn into the process chambers.

A more general object of the present invention is to provide a shield assembly which has a prolonged useful life, reducing the maintenance costs and maximizing the operational time of the CVD system, and which may be economically and efficiently manufactured and maintained.

In summary, this invention provides a durable protective shield for protecting the CVD equipment from excess film deposition and safely isolating the reaction chamber from the remainder of the process path. The shield includes a frame assembly including a pair of spaced end walls and a pair of side walls extending between and mounted to the end walls. A plurality of shield bodies are carried by the frame assembly, including injector shield bodies positioned for protection against injected reagents from the injector and shunt shield bodies spaced from the injector shield bodies for protection against exhausted reagents. Each of the shield bodies include a base, a perforated sheet carried by the base, a plenum between the base and the perforated sheet, and a gas delivery device for delivering an inert gas to the plenum at a flow rate such that the gas diffuses through the perforated sheet. In one aspect of the invention, the shield bodies are captured within the frame assembly such that the shield bodies can freely expand and contract relative to the frame assembly under varying temperature conditions. In another aspect of the invention, the perforated sheets are captured by the shield body base and end walls such that the sheets can freely expand and contract relative to the base and end walls under varying temperature conditions, maintaining the precise geometry requirements for CVD films. In another aspect of the invention, the shunt shield bodies each include an outlet port for supplying inert gas to areas below the shield to form buffer zones of inert gas on either side of the deposition zone within the processing chamber.

The invention also includes an atmospheric pressure chemical vapor deposition system which includes a plurality of processing chambers each having an injector therein for injecting reagents into the processing chamber and exhaust vents positioned on opposite sides of the injector. A conveyor transports substrates through the processing chambers along a process path. A plurality of buffer chambers isolate the processing chambers from the rest of the process path. A muffle encloses the processing chambers, the buffer chambers and the process path of the conveyor, and includes a by-pass ducts for venting the buffer chambers of muffle. A protective shield is mounted in the processing chambers for protecting the surface of the injector and the inlets of the exhaust ports. The protective shield includes injector shield bodies positioned adjacent the injector and shunt shield bodies spaced from the injector shield bodies. The shield includes an inlet port between the injector shield bodies and an outlet port between the shunt shield bodies for the flow of reagents through the protective shield. The shunt shield bodies each include a plenum filled with an inert gas and a bottom outlet port coupled to the plenum for delivering a supply of inert gas below the protective shield to form buffer barriers on opposite sides of the injection ports. This APCVD system configuration is novel in that the new protective shield can supply excess inert gas from within the processing chambers such that all flow within the buffer chambers exits the muffle through by-pass ducts instead of being drawn into the chamber process exhaust vents.

Additional objects and features of the invention will be more readily apparent from the following detailed description and appended claims when taken in conjunction with the drawings.

BRIEF DESCRIPTION OF THE DRAWINGS

FIG. 1 is a schematic view of an existing prior art (APCVD) processing system which can incorporate a new protective shield in accordance with the present invention.

FIG. 2 is a schematic view of a processing module or chamber of the CVD system of FIG. 1, illustrating an existing prior art type of gas shield.

FIG. 3 is a schematic view, partially broken away, of a protective shield in accordance with the present invention, shown installed in a processing module.

FIG. 4 is pictorial view of the shield assembly of FIG. 3.

FIG. 5 is a pictorial view of the preformed perforated screen spanning the surface between the injector outlet port and inner exhaust vent of the shield assembly of FIG. 3.

FIG. 6 is a top plan view of the end walls and internal metering tubes of the shield assembly of FIG. 3.

FIG. 7 is a front plan view of an end wall of the shield assembly of FIG. 3.

FIG. 8 is a cross-sectional view taken substantially along line 8—8 of FIG. 7.

FIG. 9 is an enlarged view taken substantially of area within circle 9—9 of FIG. 7.

FIG. 10 is an end view of an injector section gas delivery assembly of the shield assembly of FIG. 3.

FIG. 11 is an enlarged view taken substantially of area within circle 11—11 in FIG. 10.

FIG. 12 is an end view of the shunt section gas delivery assembly of the shield assembly of FIG. 3.

FIG. 13 is an enlarged view taken substantially of area within circle 13—13 in FIG. 12.

FIG. 14 is a cross-sectional view of a shield assembly in accordance with another embodiment of the invention.

FIG. 15 is a schematic view of a new CVD system process muffle enabled to exhaust excess chamber gas out buffer modules while ensuring safe containment of process gases through use of the new shield.

DETAILED DESCRIPTION OF THE INVENTION

Reference will now be made in detail to the preferred embodiment of the invention, which is illustrated in the accompanying figures. Turning now to the drawings, wherein like components are designated by like reference numerals throughout the various figures, attention is directed to FIGS. 1 and 2.

FIG. 1 schematically illustrates a section of an existing prior art CVD processing system 10 with which the protective shield assembly of this invention is used. As is known in the art, atmospheric pressure CVD systems typically include one or more processing modules or chambers 11 positioned along the process path. The components of the processing module 11 are shown in FIG. 2. Each processing module 11 includes an injector 14 for injecting chemical reagents and other gaseous substances into a reaction chamber or process area, generally designated 16, directly below the injector 14. In the illustrated example, the CVD system 10 includes four processing modules 11 as shown in FIG. 1, although it is to be understood that the number of processing modules 11 employed depends upon the constraints of a particular process. Conduits 18 deliver the gaseous substances to the injectors 14, which transport the gases through separate flow paths to one of the injection ports 20. Although not shown, each port 20 extends lengthwise along the longitudinal axis of the injector 14 to deliver the gaseous substance in a sheet-like flow to the reaction chamber 16. The substrate 22 is transported along the process path by a conveyor 24.

The entire process path is enclosed within a muffle 26 which provides a clean, contaminant free environment for the transport and processing of the substrate. As shown in FIG. 1, the processing modules 11 are separated by buffer modules 27 which isolate the processing modules 11 from the rest of the processing path. As shown in FIG. 2, the buffer modules 27 include a plurality of curtains 28 hanging from a plenum body 30 which is used to deliver an inert gas such as nitrogen between the curtains 28. Deposition waste products including unreacted gas are expelled from the reaction chambers 16 through exhaust vents 32 which are coupled to a suitable exhaust system (not shown). The chamber deposition area 16 and substrate 22 are retained at the desired reaction temperature by heating elements 34.

As the substrate is moved through each reaction chamber 11, the injected substances react with each other and/or with the upper surface of the substrate 22 to form a thin, uniform layer or film. The actual reagents used in the CVD process depend in part upon the type and quality of film desired. In one application of the processing system 10, the inner port 20 is coupled via injector 14 and one conduit 18 to a silicon source reactant such as TEOS, silane or disilane with nitrogen, and if desired a dopant source reactant such as TMPi, TMB, phosphine and/or diborane. The reagent is typically supplied with an inert carrier gas such as nitrogen. Oxygen or a combination of oxygen and ozone and nitrogen is delivered through another conduit 18 and the injector 14 to the outer ports 20. A stream of pure nitrogen travels through another conduit 18 to the intermediate separator ports 20 to separate the silicon, boron, and phosphorus source reactant from the oxidizing species until the gases approach the wafer surface.

One application of the shield 12 of this invention is described herein. Specifically, the shield 12 is shown protecting the front face of the injector 14 and the inlets of the exhaust vents 32. However, it is to be understood that the shield 12 may also be used in other applications such as protection of the chamber walls of process modules, or protection of the exhaust vent path including outlets. In addition, shield 12 can be applied to CVD systems operating at various pressures, not only at atmospheric pressure, such as for sub-atmospheric (SACVD) or low pressure (LPCVD) or high pressure systems. Shield 12 can also be applied to various film depositions of different composition, not only silicon oxide ($SiO_2$) or borophosphosilicate glass (BPSG) systems. The subject matter of this invention is not to be limited to any specific application.

Turning to FIGS. 3 and 4, the shield assembly 12 of this invention is positioned in front of the injector 14 and the inlets of the exhaust passageways 32 where it protects these surfaces against film deposition and the accumulation of potential contaminants. Unlike prior art shields, the shield assembly 12 of this invention also more precisely defines the boundaries of the reaction chamber deposition area 16. As discussed in more detail below, the shield 12 also prevents migration of the reagents outside the shunt sections of the shield 12, confining the reaction chamber deposition zone 16 to a precisely defined area. By controlling the size of the deposition area, the shield 12 of this invention provides greater control over the reaction chemistries and flow occurring within the chamber, thereby improving the quality and uniformity of the film deposited on the substrate.

The shield 12 has a modular construction and generally includes a number of separate shield bodies 40. Two of the shield bodies 40a and 40b cooperate to define the back wall 42 of the shield body 12 which is positioned against the front face of the injector 14 to wrap around the outer edges of the injector 14. This configuration ensures the front face of the injector 14 and the inlet edges 50 of the exhaust vents 32 will be substantially isolated from reaction by-products and unused reagents. The shield bodies 40a and 40b are spaced apart to define an inlet port 46 of the shield for the flow of the reagents injected by injector 14 through the shield. The size, shape and configuration of the inlet port 46 is dependent upon the configuration of the injection ports 20 of the specific injector 14 employed in the processing system 10. In this embodiment, the inlet port 46 has a narrow, elongate configuration and is sized so that the edge of the port 46 is positioned just outside of the outermost injection ports 20 to provide maximum protection for the front face of the injector 14. However, it is to be understood that the configuration of the inlet port 46 is subject to considerable variation within the scope of this invention. For example, in other modifications of the invention the shield bodies 40a and 40b may be combined into a single assembly and the inlet port 46 defined by an opening formed through the unitary assembly.

Shield bodies 40c and 40d are positioned below, and slightly outwardly of, the shield bodies 40a and 40b, with the inside edges 48 of the shield bodies 40c and 40d cooperating to define the beginning of the inner exhaust paths 116 leading to the exhaust vent inlets 50 of the exhaust vents 32 to remove process gases from the deposition zone 16. The shield bodies 40c and 40d are spaced apart, forming an outlet port 58 of the shield assembly 12 therebetween. The outlet port 58 is aligned with the inlet port 46, and is considerably larger than the inlet port 46. Since the shield 12 of this invention provides the boundaries of the reaction chamber deposition zone 16, the width of the outlet port 58 substantially defines the deposition area. In the illustrated embodiment, the outlet port 58 has a width of about 2.5 inches compared to the inlet port width of 0.25 inches. However, it is to be understood that the size and configuration of the outlet port 58 may be tailored to the constraints of a particular application.

The shield bodies 40 mate with end walls 62 to form the enclosed volume through which protective gas is introduced. The end walls 62 also have a U-shaped configuration to wrap around the front of the injector 14. Side walls 64 are mounted to the end walls 62 by bolts 63 or other suitable fasteners, thereby securing the various components of the shield 12 together. In the preferred embodiment, the shield bodies 40 are not mounted directly to the end walls 62 but allowed to expand and contract under varying temperature conditions as is described below in relation to FIGS. 7 and 8. The end walls 62 include outward projecting dowels 65 which facilitate assembly of the shield 12 by providing the correct alignment and spacing of said end walls when the side walls 64 are attached. Using bolts or other similar fasteners to secure the side walls 64 to the end walls 62, with the shield bodies 40 captured within this framework, allows the shield bodies to be easily assembled and taken apart, providing a modular shield body 12 which may be conveniently cleaned and maintained as is described in more detail below. However, in other forms of the invention, means which do not permit quick dismantling of the shield 12 may be used to secure the shield together.

The side walls 64 are spaced outwardly of the shield bodies 40a and 40b to define exhaust ports 50 for delivering exhaust directly to the exhaust vents 32. The upward-extending portion of the shield bodies 40c and 40d is spaced from the interior of the side walls 64, thereby dividing the gas flow path into exhaust ports 50 into two sections on each side, the purpose of which is described in more detail below. The side openings 66, which allow substrates to be transported through the process modules 11, also provide for the passage of gases from the buffer modules 27 outside the process modules 11 through the exhaust paths 68 formed between the inside edges of the side walls 64 and the exterior of the shield bodies 40c and 40d to the exhaust port 50. Instead of using the gap between the side walls 64 and the upward extending portions of the shield bodies 40c and 40d to form the side exhaust paths 68, it is to be understood that the side exhaust port may be provided by an opening in the side walls 64. In another embodiment of the invention, inert gas introduced through the shield bodies 40c and 40d may flow up the outer exhaust paths 68 and out into the buffer zones 27 through openings 66.

The exposed surfaces of the shield bodies 40 are protected from the chemical reagents by barriers of inert gas such as nitrogen, argon, helium or other suitable gases. The nitrogen minimizes film deposition by blocking the surfaces of the shield bodies 40 from the chemical reagent stream. Since shield bodies 40a and 40b are substantially identical, although reversed relative to one another, only shield body 40a will be described in detail with the description applying equally to shield body 40b. The shield body 40a includes a perforated sheet or screen 76 which is bent or pre-formed to the desired shape, shown in FIG. 5, such that the sheet 76 stands away from the base 42 of the shield body 40a to form a plenum 78. The perforated sheet preferably has a thickness in the range of 0.005 to 0.012 inches, for example 0.008 inches. Suitable materials for the perforated sheet include stainless steel, inconel, or other similar alloys. The porosity of the screen is on the order of 10%–30%.

A gas supply device is used to fill the plenum 78 with an inert gas such as nitrogen at a flow rate such that the nitrogen permeates the perforated sheet 76 and forms a nitrogen cloud in front of the sheet 76. In the illustrated embodiment, one or more conduits or metering tubes 80 are positioned in the plenum 78 and coupled through the end walls 62 to an exterior source of inert gas (not shown) for delivering the gas to the plenum. The wall of the metering tube 80 is porous, allowing the gas to diffuse uniformly through the tube wall in all directions. Thus, extraction of the gas from the metering tube is not limited to discrete holes formed in the conduit wall as in prior art systems. With such prior art systems, the discrete holes drilled in the solid tube cause the gas to exit each hole at a high velocity, maintaining a high degree of momentum from the thin metal surface and creating localized jets of gas within the plenum. These localized jets result in a non-uniform distribution of inert gas in the plenum and along the front of the screen, adversely affecting the protection afforded against more rapid deposition on the screen and the uniformity of the reagents within the chamber and the uniformity of the deposited film. With the metering tube 80 of the present invention, the gas diffusion occurs evenly along the entire length and circumference of the tube, filling the entire plenum with the gas at a uniform rate. Thus, the conduit 80 provides a low-velocity, uniform supply of gas free of localized effects. Materials for conduit 80 which exhibit the desired porosity include nickel, stainless steel, or silicon carbide. While the metering tubes 80 are preferred, it is to be understood that the conduits 80 may be replaced with the prior art conduits having a solid wall formed with a series of holes for injecting the inert gas into the plenum.

To achieve a uniform distribution of gas within the plenum, the metering tube 80 or a number of conduits in combination preferably extend substantially along the length of the plenum 78. As shown particularly in FIG. 3, the metering tube 80 is located in the vicinity of the inlet port 46 to provide a substantial nitrogen concentration in the deposition zone. The nitrogen or other inert gas is supplied to metering tube 80 at a flow rate which ensures the plenum will be continuously filled with sufficient gas to provide a satisfactory gas barrier across the entire surface of the perforated sheet 76. Typical flow rates of nitrogen gas used in shield bodies 40a and 40b for the APCVD process modules described herein are approximately 5 to 15 standard liters per minute.

In the preferred embodiment, the shield 12 has a modular design to be easily and conveniently cleaned and maintained. As shown in FIG. 6, the metering tube 80 is inserted through an opening formed in the end wall 62 and secured in place via a mounting member 81 provided at the end of the conduit. C-ring seals 82 or other suitable sealing means provide a seal between the metering tube 80 and the end wall 62. Gas is delivered to the end wall 62 via gas supply tubes 83 (FIG. 4) and fittings 84. The gas flows through internal passages formed in the end wall (not shown) and enters the metering tube 80 via an opening 85 in the tube. In this embodiment, the metering tube 80 of each shield body 40a and 40b is inserted through a different one of the end walls 62. However, in other modifications of the invention, the metering tubes 80 for both shield bodies 40a and 40b may be inserted through the same end wall. Inserting the metering tubes through the end walls allows the metering tubes 80 to be easily removed without detaching one or both of the end walls 62 or removing the screens 76. While the ability to remove the conduit 80 through the end plate 62 is advantageous, it is to be understood that other embodiments of the invention may include conduits which are entirely contained within the plenum 78 or attached to the inside of an end wall, requiring removal of an end plate 62 to remove the conduit.

CVD processing typically occurs at elevated temperatures, often as hot as 600° C. With prior art shields, the screen is exposed to the hot chamber while the shield backplate is situated behind a plenum filled with a continuous stream of nitrogen. Thus, the back plate is at a lower temperature than the screen. The smaller thickness, lower mass, and higher temperature of the screen causes the screen to expand faster and to a greater extent relative to the backplate. Since the screen is welded directly to the backplate, this thermal expansion causes the screen to warp, bend or buckle. Repeated heating of the shield may cause the screen to crack. Prior art shields have used embossed indentations formed in the screen or other means to reduce this buckling effect. However, these measures have not completely overcome the buckling problem. Moreover, the deformation of the screen and the embossed indentations distort the geometry of the reaction chamber, interfering with the uniform distribution of reagents within the chamber deposition zone 16. With the shield 12 of this invention, buckling of the perforated screen is substantially eliminated as it is free floating rather than constrained at its edges.

In the preferred embodiment of the invention, the shield body 40a is not affixed or welded to the end walls 62, and the perforated sheet 76 is not affixed or welded to the shield base 42 or end walls 62. Instead, the shield body 40a and the perforated sheet 76 are held in place in a manner which permits movement of the shield body 40a and sheet 76 relative to the framework of the end and side walls 62 and 64 as the shield body 40a and sheet 76 expand and contract under varying temperature conditions without creating internal compressive stresses which could lead to buckling, warping and the like. The interior of at least one and preferably both of the end walls 62 are shaped to hold the ends of the perforated sheet 76 and the base 42 of the shield body. As shown in FIGS. 7 and 9, the end wall 62 includes a channel 88 formed in the end wall 62 which corresponds to the shape of the pre-bent perforated sheet 76. The ends 87 of the perforated sheet are seated in a channel 88, with the walls of the channel 88 holding the sheet ends in place. The end wall 62 also includes a recessed area 89 which conforms to the shape of the base 42 of the shield body 40a. The shield body 40a is seated in this recessed area to couple the shield body 40a to the end walls 62. The walls of the channel 88 and the recessed area 89 also substantially seal the ends of the sheet, preventing the flow of gas around the end of the perforated sheet.

The channel 88 and recessed area 89 have a depth such that, at temperatures near room temperature, there is a significant gap between the ends of the sheet 76 and base 42 of the shield body 40a to the closed end of the channel 88 and recessed area 89. At the elevated operating temperatures, which are typically greater than 400°, the perforated sheet 76 and base 42 can expand, causing the ends of the sheet 76 to substantially fill the channel 88. The channels 88 and recessed areas 89, which are formed in both end walls 62, accommodate expansion of the perforated sheet, minimizing or even eliminating buckling or warping of the perforated sheet. In the present embodiment, in which the perforated sheet 76 is formed of stainless steel and has a thickness of about 0.008 inch and an insertion length of about 0.150 inch into the channel 88, the channel 88 has a depth in the range of 0.200 inch and a breadth in the range of 0.0085 to 0.010 inch. The recessed area 89 also has a depth in the range of 0.200 inch to accommodate a similar insertion depth of 0.150 inch of the base 42, and the tolerance in the range of 0.001 to 0.005 inch in breadth greater than the shape of the base 42.

The side edges 90 and 97 of the perforated sheet 76 are held by the shield body 40a in a manner which permits movement of the sheet 76 relative to the base 42 of the shield body. As shown in FIGS. 10, the base 42 of the shield body 40a includes a curved support surface 91 having a longitudinally extending bore 92 formed therein. The side edge 90 of the perforated screen 76 is slipped into the bore 92 and the locking pin 93 slipped into the space between side screen edge 90 and the wall of the groove 92. While the pin 93 holds the edge 90 of the screen 76 in the groove, the pin is not affixed to either the sheet 76 or the base 42. As the screen 76 expands under elevated temperature conditions, the side edge of the screen 90 is allowed to travel in a clockwise direction around the pin 93 such that the sheet 76 may expand without creating the internal forces which will eventually damage or distort the sheet. As shown in FIGS. 10 and 11, the base 42 of the shield body 40a also includes a longitudinally extending bore 94 formed through the base 42. A slit 95 extends outwardly from the bore 94. The side edge 97 of the perforated sheet 76 is inserted through the slit 95 and into the bore 94, a locking pin 96 inserted into the bore 94 secures the sheet edge in place, while permitting the sheet edge to expand around the locking pin 96 as described above.

The shield bodies 40c and 40d are similar to the shield bodies 40a and 40b. Only shield body 40c is described in detail since the shield bodies 40c and 40d are identical, although reversed relative to one another. This description applies equally to the shield body 40d. The shield body 40c includes a perforated sheet or screen 98 which is spaced from the base 99 of the shield body 40c, forming a plenum 100 between the perforated sheet 98 and the base 99. A gas supply device, such as one or more metering tubes 102, fills the plenum with an inert gas such as nitrogen. The metering tube 102 is substantially identical to the metering tube 80, described above. In this embodiment, the metering tube 102 of each shield body 40c and 40d extends through a different one of the end walls 62. However, if desired the metering tubes 102 of both bodies 40c and 40d may be mounted to the same end wall 62. The metering tube 102 fills the plenum 100 with the gas, and the gas passes through the sheet 98 and forms a gaseous cloud in front of the screen 98 to inhibit film deposition on the screen.

As with shield body 40a, the shield body 40c is captured by the end walls 62 and the perforated sheet 98 is captured by the shield base 99 and end walls 62 such that the base 99 and perforated sheet 98 are movable relative to the end walls 62 and each other during expansion and contraction of the sheet under varying temperature conditions. The end walls 62 include a channel 104 into which the ends of the perforated sheet 98 are seated (FIGS. 7–8). The end wall 62 is also formed with a recessed area 106 shaped to receive the ends of the base 99 of the shield body 40c. The walls of the channel 104 and recessed area 106 hold the shield body 40c in place and prevent the leakage of gas from the ends of the plenum 100. A gap exists between the edges of the perforated sheet 98 and base 99 to the bottom of the channel 104 and recessed area 106 to permit expansion of the perforated sheet 98 and the base 99 under varying temperature conditions. As discussed above in relative to the shield body 40a, the perforated sheet 98 and base 99 can expand as temperatures increase causing the ends of the sheet to move deeper into the channels 104 and the ends of the base 99 to move deeper into the recessed area 106. Thus, the channel 104 and recessed area 106 of the end walls 62 hold the shield body 40c in place while permitting expansion and contraction of the shield body 40c and screen 98 under varying temperature conditions.

The side edges of the perforated sheet 98 are also retained by the base 99 of the shield body 40c in a manner which permits movement of the screen 98 relative to the base 99 as the screen expands and contracts. As shown particularly in FIGS. 12 and 13, the base 99 includes a first retainer 108 and a second retainer 110 for holding the side edges of the perforated sheet 98. In this embodiment, the retaining members 108 and 110 are provided by longitudinally extending slots formed in the base 99. The side edges of the perforated screen 98 are seated in the slots 108 and 110, which hold the edges in place while permitting expansion and contraction of the screen 98 under varying temperature conditions. In this embodiment, the slots 108, 110 each have a depth of about 0.10 inch and a width of about 0.010 inch.

With the channels and recessed areas formed in the end walls 62 and the configuration of the base 42 of the shield bodies 40a, 40b and the base 99 of the shield bodies 40c, 40d, the perforated sheets 76 and 98 may be easily slipped into said bases and said shield bodies inserted into said end walls. The shield assembly 12 is easily completed by attaching the side plates 64 to the end wall 62 with as few as four bolts 63, and inserting the four metering tubes 80 and 102, each with a single fitting 81. Even with the nitrogen barriers, some film may be deposited on the surfaces of the perforated sheets 76 and 98 after processing for extended periods of time. When the accumulated film begins to interfere with the operation of the shield 12, the shield 12 may be easily dismantled to remove the shield bodies 40 for cleaning or replacement of the coated screens. New or clean screens 76 and 98 or shield bodies 40 may be installed for continuous operation while the used screens or bodies 40 are cleaned, reducing the time during which the processing system 10 is idle or shut down. The shield bodies 40 and screens 76 and 98 may be reused at a later time after they have been cleaned. The porous metering tubes 80 and 102 may also be easily removed from a whole shield body 12, in case cleaning of the remaining parts as a unit is desired.

FIG. 14 shows an embodiment of a shield body 12 which includes a different type of retainer 90a for holding the perforated screen in place. The principle of operation is the same as the technique already described to attach screen 76 to base 42 (FIG. 10) in that two parts interlock, creating the geometry which acts to capture the screen without constraining the edge of the screen. The shape of retainer 90a is just different than the simple rods 93 and 96 used for shield body 40a.

Additionally, different shapes of the slots and screen edges than described to attach screen 98 to base 99 (FIG. 12) can be employed as well, as shown in FIG. 14 by slot 90b.

As is shown in FIG. 3, the passageways 116 provided between the shield bodies 40a and 40b and the shield bodies 40c and 40d deliver unused reagents and reaction by-products directly to the exhaust ports 50, ensuring the efficient removal of the process exhaust from the deposition zone 16. This is different from prior art shields, which do not direct the gases to the exhaust vents within a controlled path, but merely provide a layer of inert gas in front of the exposed surfaces of the injector and exhaust vent inlets. Nitrogen emitted through and covering the perforated sheets 76, 98 isolates the perforated sheets from the chemical reagent stream and inhibits deposition of film on the surface of the perforated sheets. A uniform supply of the inert gas is provided in front of each perforated screen since buckling, warping or other deformation of the screen is avoided by allowing the screens to move relative to the shield body and end plates under varying temperature conditions. Thus, the more uniform layers of inert gas improves the quality of the deposited film by reducing the accumulation of contaminants within the chamber and promoting uniform distribution of the reagents within the chamber.

With the shield 12 of this invention, the deposition area 16 is confined to the area of the substrate directly below the outlet port 58. As shown in FIGS. 3 and 12, the shield bodies 40c and 40d each create dual exhaust paths to the exhaust vent inlet 50 and also include a bottom outlet port 122 formed in the base 99 of the assembly. The bottom outlet port 122 causes a stream of inert gas to flow from the plenum 100 through the base 99 to the area below the shield adjacent to the outlet port 58. The substrate 22 or the conveyor 24 causes separation of the flow from the bottom outlet port 122 into a shunt containment flow, designated at 124, and a shunt outflow, designated at 126. The shunt containment flow 124 provides a buffer of inert gas below the shield bodies 40c and 40d, preventing the reagents or reaction by-products from leaving the deposition zone 16 by escaping beneath the shield 12. The containment shunt flow 124 isolates the reaction chamber, allowing the width of the deposition zone to be precisely controlled and improving process performance.

The shunt outflow 126 flows around the shield bodies 40c, 40d and through the outer shunt exhaust path 68 to the exhaust port 50. Directing this stream of inert gas to the exhaust port 50 ensures the process exhaust via path 116 from the deposition area 16 will be carried directly to the exhaust vent 32 for extraction from the system 10 and also dilutes the chemical concentration and increases velocity to ease the removal of by-products. The shunt outflow 126 also provides a barrier between the buffer modules 27 and the reaction chamber deposition area 16, effectively isolating the reaction chamber from the conditions in the areas upstream and downstream of the process modules 11.

The shield 12 of this invention creates a buffer gas zone on opposite sides of the reaction chamber. The inert gas is delivered to the plenum 100 at a flow rate sufficiently high to maintain a constant flow stream for both the shunt containment flow 124 and the shunt outflow 126 as well as the protective flow through the screen 98, ensuring the desired buffer zone is created on either side of the deposition zone. With the shunt containment flow 124 and shunt outflow 126, the deposition zone boundary and the process gas flows can be precisely and uniformly controlled as all the gases are supplied and metered within the chamber, producing a higher quality film.

With prior art systems, an example of which is shown in FIGS. 1 and 2, the exhaust flow rate to vents 32 is greater than the rate at which gases are supplied within the chamber area of process modules 11 so that the inert gas supplied by plenums 30 or from the buffer modules 27 may be drawn into the reaction chamber to form a barrier preventing the escape of reagents into the curtain area. A problem with this system is that the buffer gas is typically provided and drawn into the chamber area through side openings 66 in a non-uniform distribution, resulting in a non-uniform distribution of reagents along the edges of the chamber which detracts from the uniformity of the film deposited on the substrate 22. The inflow of gas from the curtain area 27 and the flow of process exhaust from the injector 14 within the chamber to the exhaust vent 32 create a large stagnant pocket between the two flow streams where reagents and reaction by-products are recirculated. The recirculating gases interfere with the ability to precisely control the reaction chemistry within the complete deposition zone 16. These problems with the prior art processing systems are overcome by the shield of this invention.

With prior art shields, the recirculating flow is produced in the relatively large area between the exhaust inlet to vent 32 and the upper surface of the conveyor 24 or substrate 22. With the shield of this invention, the shunt containment flow 124 and the streamlined shape of the shield bodies 40c and 40d effectively minimizes the amount of recirculation of the reagents where the gas streams meet, ensuring the reagents are efficiently exhausted through exhaust vents 32. In the embodiment shown in FIG. 3, the shunt section shield bodies 40c and 40d are located to substantially physically block the large recirculation volume present in the prior art shield represented in FIG. 2.

With the shield 12 of this invention, the inert gas supplied by the shield bodies 40 ensures that the reagents and reaction-by-products will be safely retained within the deposition area 16. With the new shield 12 this containment can be accomplished where gas is introduced into the chamber either at a lower or greater rate than the flow rate of the exhaust through vents 32. So inert gas can either be flowing into or out of the process module 11 through openings 66, whereas the prior art has to draw gas from buffer module 27 in through openings 66 to provide containment. The gas which is not accommodated by the exhaust vents 32 flows into the buffer modules 27 between the process modules 11 and is removed from the muffle via by-pass ducts 130 connecting the buffer modules 27 to a separately controlled exhaust vent, as shown in a new muffle design in FIG. 15. Since the reagents are safely contained within the reaction chamber and delivered directly to the exhaust ports 50 and vents 32, the gas which is vented through the by-pass valves is nitrogen. No reagent or by-products are carried to the by-pass vents 130. Utilizing the by-pass ducts 130 to extract excess inert gas from the process modules allows all the gas flow within the process chambers to be supplied and controlled by the geometry within the chambers, more effectively isolating the process results of deposition on wafers inside the chambers from any external disturbances or non-uniformity present as in an open APCVD system.

As is apparent from the forgoing, the present invention provides a shield 12 which may be used to achieve improved uniformity of reagents within the reaction chamber, greater control over the reaction chemistry residence time, and precise control over the geometry of the reaction chamber 16 and deposition zone, thereby enhancing the quality of the deposited film. The shield 12 can withstand changing temperature conditions without damaging or deforming parts of the shield which could reduce the effectiveness of the shield operation. The shield 12 is modular, and may be conveniently and quickly assembled and dismantled for maintenance or cleaning. The shield 12 includes metering tubes 80, 102 which deliver the inert gas to the plenum in a more uniform distribution, improving the uniformity of the reagents within the deposition zone 16. The shield is used to form a barrier or buffer zone on opposite sides of the reaction chamber, preventing reagents from escaping from the chamber and allowing a uniform distribution of buffer gas to be provided within the muffle 26. It is to be understood that this invention is not limited to the shield 12 of the illustrated embodiment which includes each of the features described herein. Instead, it is to be understood that shields incorporating only some of the features described herein is within the scope of this invention.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the claims appended hereto and their equivalents.

What is claimed is:

1. A protective shield for chemical vapor deposition systems comprising:
    a frame assembly including a pair of spaced end walls and a pair of side walls extending between and mounted to said end walls; and
    a plurality of shield bodies carried by said frame assembly, each of said shield bodies including a base, a perforated sheet carried by said base, a plenum partially defined by said base and said perforated sheet, and a gas delivery device for delivering an inert gas to said plenum at a flow rate such that the gas diffuses through said perforated sheet.

2. The protective shield of claim 1 in which a pair of said shield bodies are positioned to define a first surface of said protective shield which is positionable proximate an injector body, said shield bodies being spaced apart to define an inlet port therebetween for the flow of reagents through said protective shield.

3. The protective shield of claim 2 in which a second pair of said shield bodies are positioned to define a second surface of said protective shield opposite said first surface, said second pair of said shield bodies being spaced apart to define an outlet port therebetween for the flow of reagents through said protective shield.

4. The protective shield of claim 3 in which said second pair of shield bodies include a bottom outlet port coupled to said plenums thereof for the flow of the inert gas through said shield bodies to form an inert gas barrier zone below said second surface on opposite sides of said outlet port.

5. The protective shield of claim 1 in which at least one of said shield bodies is spaced from one of said side walls to define an exhaust port therebetween.

6. The protective shield of claim 5 in which said shield extends between and is spaced from said one of said side walls and said at least one of said shield bodies to define a first exhaust passageway between said at least one of said shield bodies and said another of said shield bodies and a second passageway between said another of said shield bodies and said one of said side wall.

7. The protective shield of claim 1 in which said shield bodies each have spaced ends and said end walls are shaped to mate with the ends of said shield bodies to hold said shield bodies in said frame assembly.

8. The protective shield of claim 7 in which said end walls have slots formed therein shaped to make with the ends of said shield bodies and the ends of said shield bodies are seated in said slots.

9. The protective shield of claim 8 in which the ends of said shield bodies are movable within said slots as said shield bodies expand and contract under varying temperature conditions.

10. The protective shield of claim 1 in which said perforated sheet is held by said base such that said perforated sheet is movable relative to said base during expansion and contraction of said perforated sheet under varying temperature conditions.

11. The protective shield of claim 10 in which said base has a slot formed therein and said perforated sheet is seated in said slot and movable within said slot during expansion and contraction of said perforated sheet under varying temperature conditions.

12. The protective shield of claim 11 in which said base has a bore formed therein and a locking pin seated in said bore, said slot being provided by the wall of said bore and the exterior of said locking pin.

13. The protective shield of claim 11 in which said base has a longitudinal bore formed therein and a locking pin seated in said bore, said slot being provided by the wall of said bore and the exterior of said locking pin.

14. The protective shield of claim 1 in which said gas delivery device is a metering tube disposed in said plenum, said metering tube having a porous wall for diffusion of the gas through said porous wall into said plenum.

15. The protective shield of claim 1 in which said gas delivery device is a conduit disposed in said plenum, said conduit extending through one of said end walls and mounted from the exterior thereof to said one of said end walls.

16. The protective shield of claim 15 in which said end wall includes a gas supply fitting connectable to an exterior gas source and a passageway formed therein for the delivery of the inert gas from said gas supply fitting to said conduit.

17. A protective shield for chemical vapor deposition systems comprising:

a frame assembly including a pair of spaced end walls and a pair of side walls extending between and mounted to said end walls; and first and second injector shield bodies carried by said frame assembly, said injector shield bodies being positioned to define a first surface of said protective shield positionable adjacent an injector, said injector shield bodies being spaced apart to define an injection port therebetween for the flow of reagents from the injector through said protective shield, said injector shield bodies being spaced from said side walls to define first and second exhaust ports therebetween, said exhaust ports being connectable with exhaust vents positioned on opposite sides of the injector;

first and second shunt shield bodies carried by said frame assembly, said shunt shield bodies being spaced from said injector shield bodies and positioned to define a second surface of said protective shield opposite said first surface, said first and second shunt shield bodies being spaced apart to define an outlet port therebetween for the flow of reagents through said protective shield;

said injector shield bodies and said shunt shield bodies each including a base, a perforated sheet carried by said base, a plenum partially defined by between said base and said perforated sheet, and a gas delivery device for delivering an inert gas to said plenum at a flow rate such that the gas diffuses through said perforated sheet.

18. The protective shield of claim 17 in which said shunt shield bodies extend between and are spaced from said injector shield bodies and the associated one of said side walls to form a first exhaust passageway between each of said injector shield bodies and said shunt shield bodies and a second exhaust passageway between each of said second shield bodies and said side walls.

19. The protective shield of claim 17 in which said shunt shield bodies each include a bottom outlet port coupled to said plenums thereof for the flow of the inert gas through said shunt shield bodies to form an inert gas barrier zone below said second surface on opposite sides of said outlet port.

20. The protective shield of claim 17 in which said injector shield bodies and said shunt shield bodies each have spaced ends and said end walls are shaped to mate with the ends of said shield bodies to hold said shield bodies in said frame assembly.

21. The protective shield of claim 20 in which said end walls have slots configured to mate with the ends of said shield bodies formed therein and the ends of said shield bodies are seated in said slots, said ends of said shield bodies being movable within said slots as said shield bodies expand and contract under varying temperature conditions.

22. The protective shield of claim 17 in which said perforated sheet is held by said base such that said perforated sheet is movable relative to said base during expansion and contraction of said perforated sheet under varying temperature conditions.

23. The protective shield of claim 22 in which said base has a slot formed therein and said perforated sheet is seated in said slot and movable within said slot during expansion and contraction of said perforated sheet under varying temperature conditions.

24. The protective shield of claim 17 in which said gas delivery device is a metering tube disposed in said plenum, said metering tube having a porous wall for diffusion of the gas through said porous wall into said plenum.

25. The protective shield of claim 17 in which in which said gas delivery device is a conduit disposed in said plenum, said conduit extending through one of said end walls and mounted from the exterior thereof to said one of said end walls.

26. The protective shield of claim 25 in which said end wall includes a gas supply fitting connectable to an exterior gas source and a passageway formed therein for the delivery of the inert gas from said gas supply fitting to said conduit.

27. An atmospheric pressure chemical vapor deposition system comprising:

a plurality of processing chambers each having an injector therein for injecting reagents into said processing chamber and exhaust vents positioned on opposite sides of said injector;

a conveyor for transporting substrates through said processing chambers along a process path;

a plurality of buffer chambers isolating said processing chambers from the rest of the process path;

a muffle enclosing said processing chambers, said buffer chambers and the process path of said conveyor;

a protective shield mounted in said processing chambers for protecting the surface of said injector and the inlets of said exhaust ports, said protective shield including injector shield bodies positioned adjacent said injector, shunt shield bodies spaced from said injector shield bodies, an inlet port between said injector shield bodies and outlet ports between said shunt shield bodies for the flow of reagents through said protective shield, said shunt shield bodies each including a plenum filled with an inert gas and a bottom outlet port coupled to said plenum for delivering a supply of inert gas below said protective shield to form buffer barriers on opposite sides of said outlet port.

28. The chemical vapor deposition system of claim 27 in which said buffer chambers each have at least one by-pass duct for the removal of excess gas from said muffle and in which the rate at which gases are removed from the processing chamber through said exhaust vents is less than the rate at which gases are introduced to the processing chamber such that a portion of said barrier gas injected through said bottom outlet ports of said shunt shield bodies is removed from said muffle through said by-pass ducts such that no gas from said buffer chambers has to enter said processing chambers.

29. The chemical vapor deposition system of claim 27 in which said protective shield includes a peripheral frame and said shunt shield bodies and said injector shield bodies are held within said peripheral frame such that said shunt shield bodies and injector shield bodies and their said perforated sheets are movable relative to each other and within said peripheral frame during expansion and contraction of said shunt shield bodies and said injector shield bodies and perforated sheets under varying temperature conditions.

* * * * *